(12) United States Patent
Han

(10) Patent No.: US 7,256,133 B2
(45) Date of Patent: Aug. 14, 2007

(54) METHOD OF MANUFACTURING A SEMICONDUCTOR DEVICE

(75) Inventor: Jae-Won Han, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/321,118

(22) Filed: Dec. 28, 2005

(65) Prior Publication Data

US 2006/0148239 A1    Jul. 6, 2006

(30) Foreign Application Priority Data

Dec. 30, 2004    (KR) ............... 10-2004-0117125

(51) Int. Cl.
*H01L 21/302* (2006.01)

(52) U.S. Cl. ............... 438/720; 438/672; 438/700; 438/706

(58) Field of Classification Search ........... 438/706, 438/710, 712, 714, 720, 700, 629, 672
See application file for complete search history.

(56) References Cited

U.S. PATENT DOCUMENTS

2005/0006222 A1 * 1/2005 Ding et al. ............... 204/192.1
2005/0101118 A1 * 5/2005 Kimura et al. ............ 438/623

* cited by examiner

*Primary Examiner*—Lan Vinh
(74) *Attorney, Agent, or Firm*—Andrew D. Fortney

(57) ABSTRACT

For a semiconductor device having copper wiring, an exemplary method according to an embodiment of the present invention may include forming a first insulation layer on a silicon substrate having a transistor thereon; forming a contact hole by etching the first insulation layer; forming a metal plug so as to fill the contact hole; forming a second insulation layer on the metal plug; forming a trench exposing an upper surface of the metal plug by partially removing the second insulation layer; sputter-etching an interior wall and bottom surface of the trench with a plasma; and forming a copper line layer so as to fill the sputter-etched trench. According to this method, electrical contact between a metal plug and a copper line layer may be maintained or improved prevented by reducing or removing by-products on the metal plug using the sputter-etching process.

20 Claims, 4 Drawing Sheets

METHOD OF MANUFACTURING A SEMICONDUCTOR DEVICE

CROSS-REFERENCE TO RELATED APPLICATION

This application claims priority to and the benefit of Korean Patent Application No. 10-2004-0117125, filed in the Korean Intellectual Property Office on Dec. 30, 2004, the entire contents of which are incorporated herein by reference.

BACKGROUND OF THE INVENTION (a) Field of the Invention

The present invention relates to a method of manufacturing a semiconductor device. More particularly, the present invention relates to a method of manufacturing a semiconductor device having copper wiring.

(b) Description of the Related Art

In many general logic devices, copper wiring may be more widely used than aluminum lines, which have a drawback in RC delay. Unlike aluminum wiring, copper wiring is formed by a process including steps of forming an insulation layer pattern by a damascene process and forming a copper layer thereon by an electroplating process.

FIGS. 1 to 4 are cross-sectional views showing sequential stages of a conventional method for manufacturing a semiconductor device having copper wiring.

Referring to FIG. 1, a transistor is formed on a silicon substrate 10. The transistor may include a trench oxide layer 11 for isolating an active region of the silicon substrate 10, a gate oxide layer (not shown) formed in the active region, a gate stack 16 comprising a polysilicon layer 12 and a metal silicide layer 14, a gate spacer 18 formed on sidewalls of the gate stack 16, and source/drain terminals 20 formed in alignment with the gate stack 16. The gate spacer 18 may include layers 18a, 18b, and 18c including oxide and nitride layers. In addition, a metal silicide layer 22 may be also formed on a surface of the source/drain terminals 20.

After forming a thin layer 24 on the entire surface of the transistor, a first insulation layer 26 is formed on the liner layer 24. A contact hole 28 is formed by selectively etching the first insulation layer 26 over the source/drain terminals 20 (and, generally, over the gate 16). After forming a first barrier metal layer 29 in the contact hole 28, a tungsten plug 30 is formed on the first barrier metal layer 29 so as to fill the contact hole 28. The tungsten plug 30 is formed by filing the contact hole 28 with a tungsten layer and planarizing by a chemical mechanical polishing (CMP) process.

Referring to FIG. 2, after a second insulation layer 31 is formed on the tungsten plug 30, a trench 32 may be formed by selectively etching the second insulation layer 31 by photolithography and etching to expose an upper surface of the tungsten plug 30.

Subsequently, referring to FIG. 3, a second barrier metal layer 34 is formed on an interior wall of the trench 32. Then, a copper seed layer 36 is formed on the second barrier metal layer 34.

Referring to FIG. 4, a copper line layer 38 is formed on the copper seed layer 36 so as to fill the trench 32. The copper seed layer 36 included in the copper line layer 38 is omitted in FIG. 4.

According to the conventional method for manufacturing a semiconductor device having copper wiring, even if a cleaning process follows chemical mechanical polishing of the tungsten layer of FIG. 1, residues included in slurry used in the chemical mechanical polishing process may remain on the surface of the device so as to cause a device failure. In addition, even if the tungsten layer is removed by chemical mechanical polishing, residue of the tungsten layer may remain on the surface of the insulation layer 26.

Furthermore, by-products (for example, polymers formed during the etching process for the trench in FIG. 2) may remain on a sidewall of the trench or on the tungsten plug, and these by-products may act as an insulation layer or a resistor (e.g., in the case of a very thin layer of such a by-product). The by-products cause the tungsten plug to be electrically insulated from the second barrier metal layer and the copper line layer, or could cause an unacceptable or undesirable increase in the resistivity of the tungsten plug. As a result, the semiconductor device manufactured by the conventional method may not work, or its reliability may be deteriorated.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide a method of manufacturing a semiconductor device having advantages of preventing electrical insulation between a tungsten plug and a copper line layer thereon.

An exemplary method of manufacturing a semiconductor device according to an embodiment of the present invention includes forming a first insulation layer on a silicon substrate having a transistor thereon; forming a contact hole by etching the first insulation layer; forming a metal plug so as to fill the contact hole; forming a second insulation layer on the metal plug; forming a trench for exposing an upper surface of the metal plug by partially removing the second insulation layer; sputter-etching an interior wall and bottom surface of the trench with a plasma; and forming a copper line layer so as to fill the sputter-etched trench. In a further embodiment, the method may further comprise forming a barrier metal layer on an interior wall of the contact hole. The metal plug may comprise a tungsten layer. The method may further comprise forming another barrier metal layer on the interior wall of the trench after the sputter-etching.

The barrier metal layer formed in the trench may be formed in a barrier metal deposition chamber without a vacuum break after sputter-etching. The sputter-etching may be performed by using a plasma comprising Ar, $NH_3$, $H_2$, $N_2$, or a mixture thereof.

In the sputter-etching, an RF power applied to the silicon substrate (a first RF power) may be 50-400 W, and an RF power applied to an interior wall of a process chamber (a second RF power) may be 100-400 W. A frequency of the first RF power may be 13.56 MHz or an integral multiple thereof, and a frequency of the second RF power may be 400 kHz or an integral multiple thereof.

As described above, according to a method of manufacturing a semiconductor device according to an embodiment of the present invention, electric insulation between a metal plug and a copper line layer may be prevented by removing by-products on the metal plug using a sputter-etching process (also known as a "sputter cleaning" process).

DETAILED DESCRIPTION OF THE EMBODIMENTS

An exemplary embodiment of the present invention will hereinafter be described in detail with reference to the accompanying drawings.

FIG. 5 to FIG. 8 are cross-sectional views showing sequential stages of a method for manufacturing a semiconductor device having a copper wiring according to an embodiment of the present invention.

Figure 1:
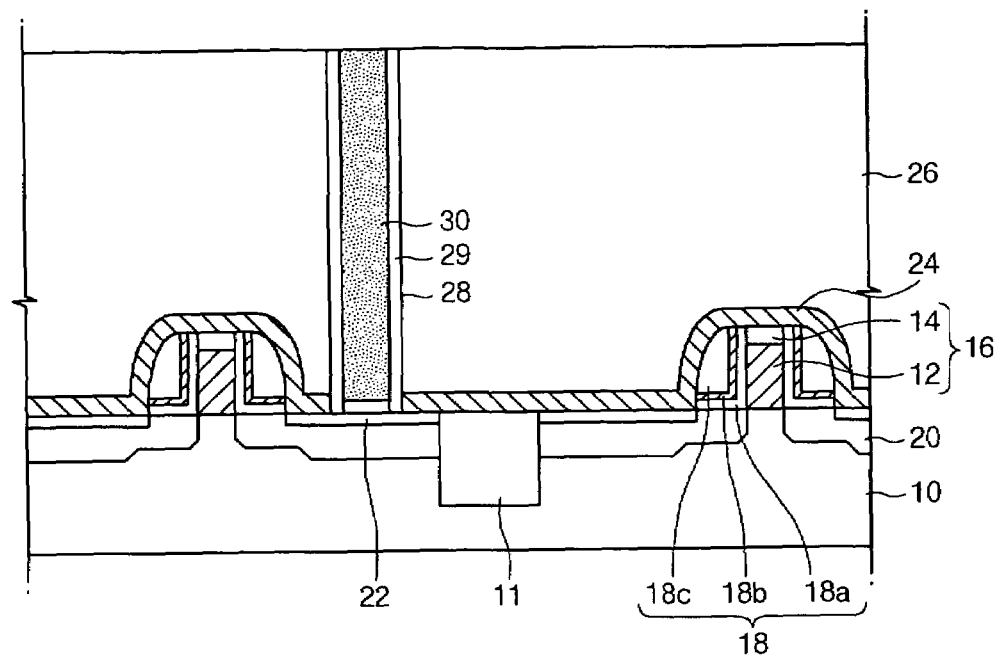
FIGS. 1 to 4 are cross-sectional views showing sequential stages of a conventional method for manufacturing a semiconductor device having copper wiring.
Figure 2:
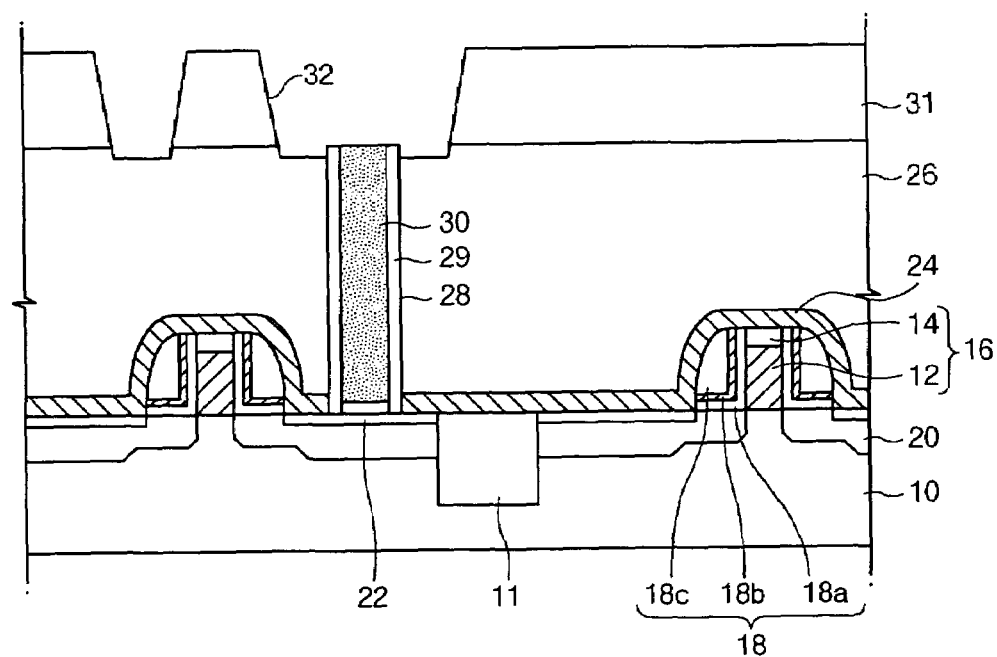
Figure 3:
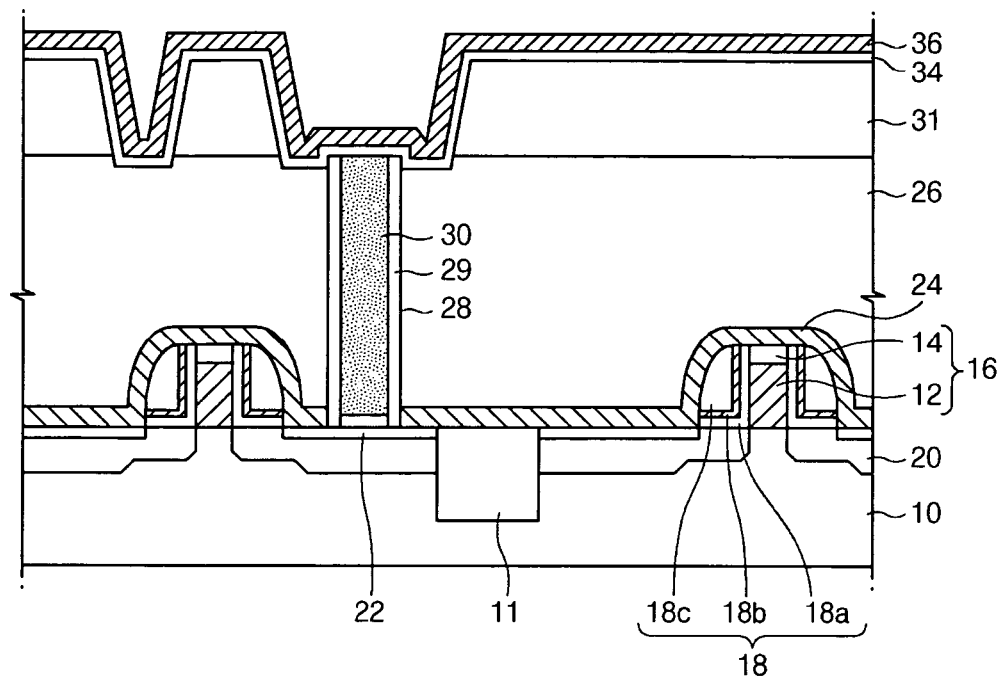
Figure 4:
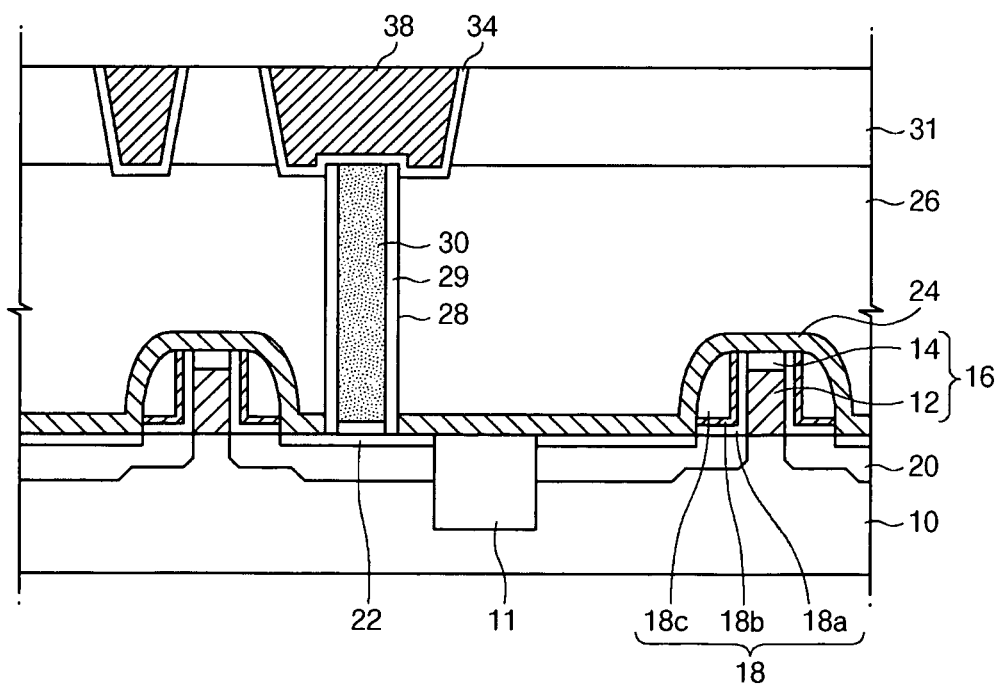
Figure 5:
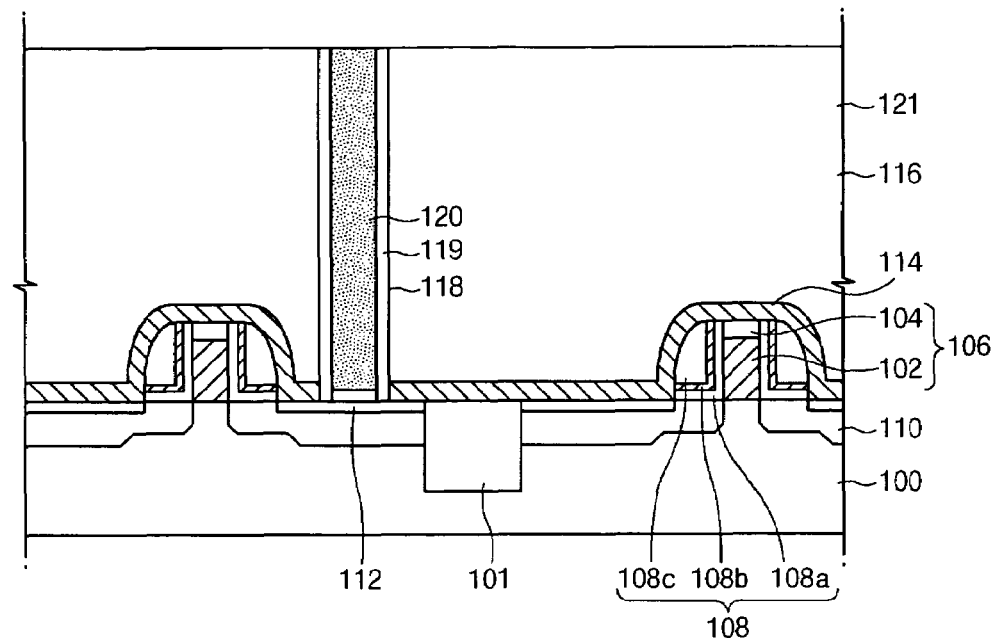
FIGS. 5 to 8 are cross-sectional views showing sequential stages of a method for manufacturing a semiconductor device having copper wiring according to an embodiment of the present invention.

Referring to FIG. 5, a transistor is formed on a silicon substrate 100. The transistor may include a trench oxide layer 101 (e.g., a shallow trench isolation structure) isolating an active region of the silicon substrate 100, a gate oxide layer (not shown) formed in the active region (e.g., under gate stack 106), a gate stack 106 comprising a polysilicon layer 102 and metal silicide layer 104, a gate spacer 108 formed on sidewalls of the gate stack 106, and source/drain terminals 110 formed in active areas of the silicon substrate 100 adjacent to the gate stack 106 (e.g., in general alignment with the gate stack 106 and/or gate spacer 108). The gate spacer 108 may comprise one or more silicon oxide and/or nitride layers. In one embodiment, the gate spacer 108 comprises a triple layer 108a, 108b, and 108c, which may include a thin oxide buffer 108a, a nitride spacer layer 108b (e.g., for aligning a conventional LDD implant region), and an oxide spacer layer 108c (e.g., for aligning the source/drain implants). In addition, a metal silicide layer 112 may be also formed on a surface of the source/drain terminals 110. In one embodiment, the metal silicide layer 112 is formed at the same time as (or simultaneously with) the metal silicide layer 104.

After forming a liner, barrier and/or etch stop layer 114 on the entire surface of the transistor, a first insulation layer 116 is formed on the liner layer 114. The layer 114 may comprise, for example, silicon nitride, and the first insulation layer 116 may comprise, for example, silicon dioxide (which may be undoped or doped with one or more conventional dopants such as fluorine, boron and/or phosphorous, etc.). Because first insulation layer 116 is between a polysilicon layer (e.g., the transistor gates) and an overlying layer of metallization, it may be referred to as an "interlayer insulation layer." A contact hole 118 is formed by selectively etching the first insulation layer 116 over the source/drain terminals 110 and, generally, over the gate stack 106. Typically, etching the first insulation layer 116 to form contact holes 118 exposes an upper surface of source and drain terminals of a transistor, as well as the corresponding gate of the transistor. After forming a first barrier metal layer 119 (e.g., TiN, TiW alloy, etc.) in the contact hole 118, a tungsten plug 120 is formed on the first barrier metal layer 119 so as to fill the contact hole 118. However, prior to forming the first barrier metal layer 119, the method may further comprise forming an adhesive layer (e.g., Ti or other silicide-forming metal) in the contact hole 118. As a result, the invention does not necessarily require formation of a salicide (or "self-aligned silicide") layer, such as layer 112. The tungsten plug 120 may be formed by filing the contact hole 118 with a tungsten layer (e.g., by chemical vapor deposition from $WF_6$ and $SiH_4$) and planarizing, for example by chemical mechanical polishing or a conventional etch-back process.

Figure 6:
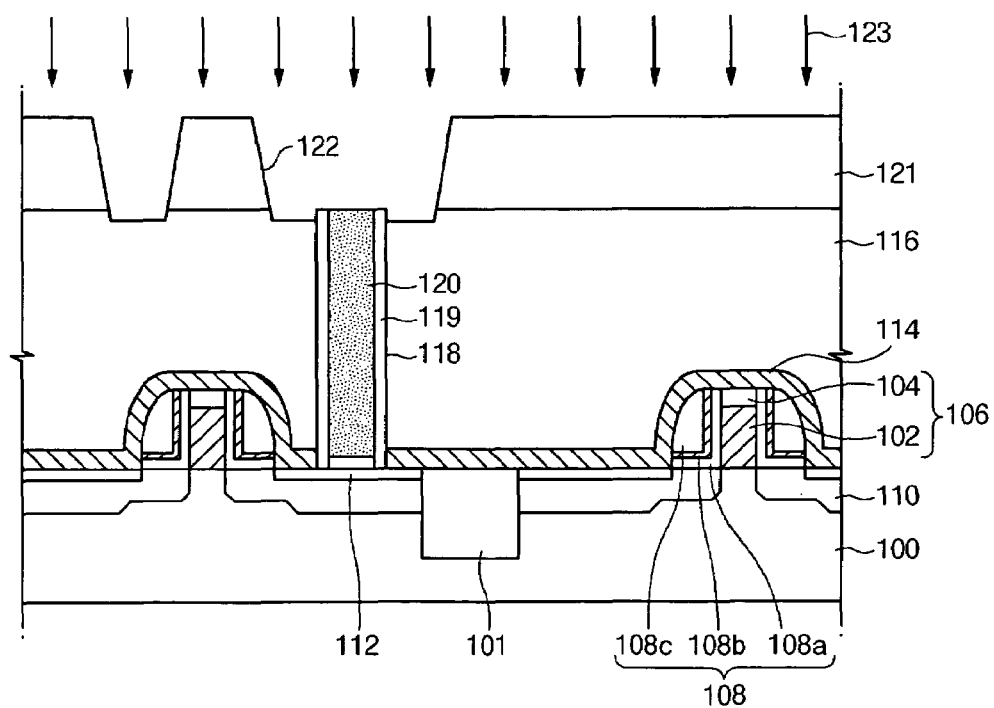

Referring to FIG. 6, after a second insulation layer 121 is formed on the tungsten plug 120 and first insulation layer 116, a trench 122 may be formed in second insulation layer 121 by selectively etching the insulation layer 121. Typically, selective etching comprises photolithography (e.g., photolithographic irradiation and patterning of a blanket-deposited photoresist) and etching to expose an upper surface of the tungsten plug 120. Then, in order to remove by-products produced during chemical mechanical polishing of the tungsten plug 120 and etching the insulation layer 121, an interior wall and bottom surface of the trench 122 are sputter-etched (or sputter- and/or plasma-cleaned) with a plasma.

By-products, such as slurry residues from the process of chemical mechanical polishing the tungsten plug 120 and polymers from etching the trench, may be removed by the sputter-etching (and/or sputter and/or plasma cleaning). The plasma in the sputter-etching/-cleaning process may comprise Ar, $NH_3$, $H_2$, $N_2$, or a mixture thereof.

The sputter-etching process 123 may be performed in a sputtering chamber of a deposition apparatus that may be used to form a second barrier metal layer in the trench 122. Process conditions in the sputter-etching process may include an RF power applied to the silicon substrate (a first RF power) of 50-400 W, and an RF power applied to an interior wall of a process chamber (a second RF power) of 100-400 W. The sputter-etching/-cleaning process conditions may further include a first RF power frequency (i.e., a frequency of the first RF power) of about 13.56 MHz or an integral multiple thereof, and a second RF power frequency (i.e., a frequency of the second RF power) of about 400 kHz or an integral multiple thereof. Gases supplied into the sputtering chamber, as described above, may include Ar, $NH_3$, $H_2$, $N_2$, or a mixture thereof. A pressure of the chamber may be less than or about 10E-7 Torr.

Figure 7:
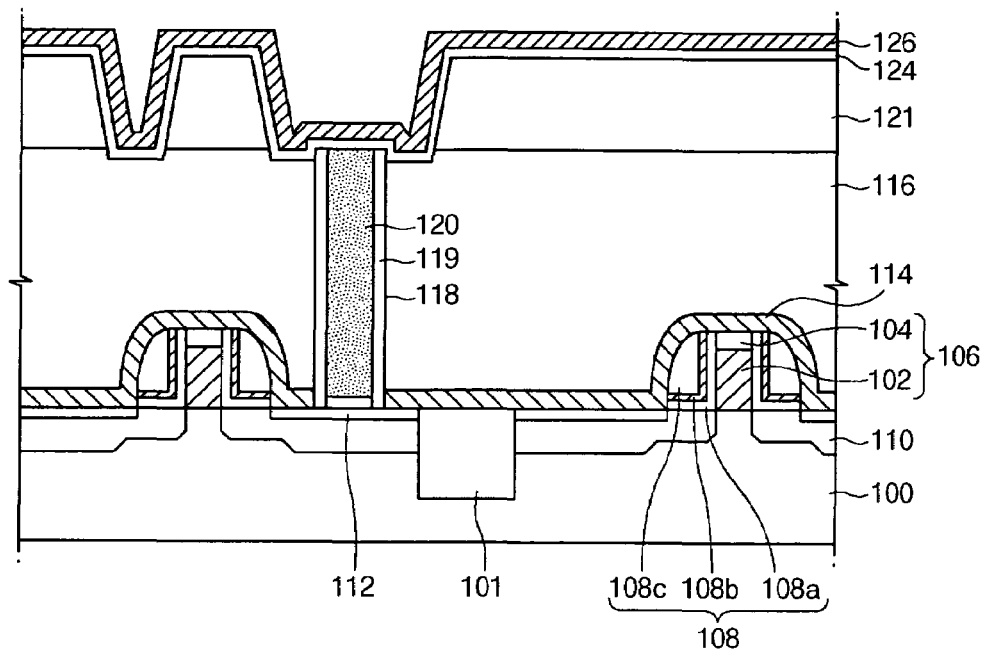

Referring to FIG. 7, a second barrier metal layer 124 is formed on an interior wall and bottom surface of the trench 122, where the by-products have been removed by the sputter-etching process. The second barrier metal layer 124 may be formed in a sputtering chamber of an apparatus adapted to deposit (or sputter) the barrier metal without a vacuum break after sputter-etching or sputter cleaning. The second barrier metal layer 124 generally comprises a conventional barrier metal used for copper metallization, such as Ti, Ta, TiN, TaN, Pd, etc. Then, a copper seed layer 126 is formed on the second barrier metal layer 124, generally by CVD from a conventional copper precursor material or electroplating (under relatively slow, controlled conditions).

Figure 8:
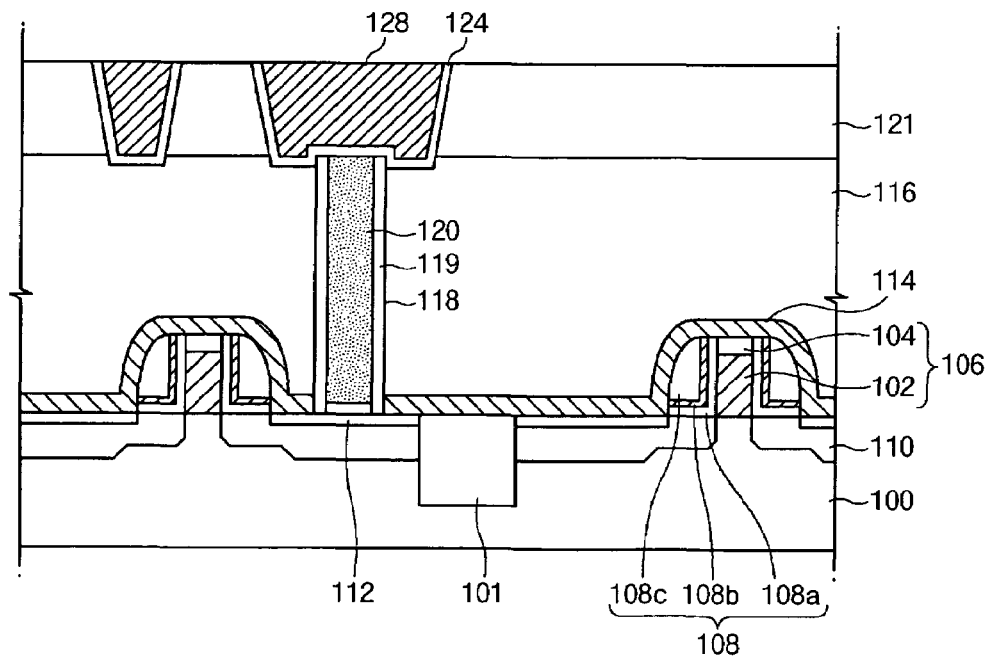

Referring to FIG. 8, a copper layer is formed or deposited on the copper seed layer 126 so as to fill the trench 122, generally by electroplating (typically under relatively fast deposition conditions). The copper line 128 is then formed by planarizing the copper layer, typically by CMP. The copper seed layer 126 included in the copper line layer 128 is omitted in FIG. 8.

As described above, a method of manufacturing a semiconductor device according to an embodiment of the present invention uses a sputter-etching (or plasma cleaning) process to reduce or prevent electric insulation or increased contact resistance between a metal plug and a copper line layer by removing or reducing by-products on the metal plug. Therefore, yield and reliability of the semiconductor device can be significantly improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:
   forming a metal plug in a contact hole in an underlying insulation layer on a substrate having a transistor thereon;
   forming an overlying insulation layer on the underlying insulation layer;
   forming a trench in the overlying insulation layer, exposing an upper surface of the metal and the underlying insulation layer;
   sputter-etching the trench and the exposed upper surface of the metal plug with a plasma; and
   forming a copper layer so as to fill the sputter-etched trench.

2. The method of claim 1, wherein the metal plug further comprises a first barrier metal layer on an interior wall of the contact hole.

3. The method of claim 1, wherein the plasma comprises Ar, $NH_3$, $H_2$, $N_2$, or a mixture thereof.

4. The method of claim 1, wherein forming the trench comprises removing a part of the overlying insulation layer.

5. The method of claim 1, further comprising forming the contact hole by etching the underlying insulation layer.

6. The method of claim 1, further comprising forming a first barrier metal layer on an interior wall of the contact hole before forming the metal plug.

7. The method of claim 1, wherein the upper surface of the metal plug has a width that is smaller than a width of a bottom of the trench.

8. The method of claim 1, wherein the trench is sputter-etched with a plasma at a pressure less than or about 10E-7 Torr.

9. The method of claim 1, further comprising forming an adhesive layer in the contact hole, wherein the adhesive layer comprises titanium or a silicide-forming metal.

10. The method of claim 1, wherein the metal plug comprises a tungsten layer.

11. The method of claim 10, wherein the plug is formed by chemical vapor deposition from $WF_6$ and $SiH_4$.

12. The method of claim 1, further comprising forming a second barrier metal layer on the interior wall of the trench after the sputter-etching.

13. The method of claim 12, wherein forming the second barrier metal layer is conducted in a deposition chamber without a vacuum break after the sputter-etching.

14. The method of claim 1, wherein the sputter-etching comprises applying a first RF power to the silicon substrate of 50-400 W, and applying a second RF power to an interior wall of a process chamber of 100-400 W.

15. The method of claim 14, wherein a frequency of the first RF power is about 13.56 MHz or an integral multiple thereof, and a frequency of the second RF power is about 400 kilz or an integral multiple thereof.

16. The method of claim 1, wherein:
   the method further comprises forming a first barrier metal layer on an interior wall of the contact hole;
   the metal plug comprises a tungsten layer on the first barrier metal layer;
   the method further comprises forming a second barrier metal layer on an interior wall of the trench after the sputter-etching;
   the plasma comprises Ar, $NH_3$, $H_2$, $N_2$, or a mixture thereof; and
   the sputter-etching comprises applying a first RF power to the silicon substrate of 50-400 W, and applying a second RF power to an interior wall of a process chamber of 100-400 W.

17. The method of claim 16, wherein:
   forming the second barrier metal layer is conducted in a deposition chamber without a vacuum break after sputter-etching; and
   a frequency of the first RF power is about 13.56 MHz or an integral multiple thereof, and a frequency of the second RF power is about 400 kHz or an integral multiple thereof.

18. The method of claim 16, further comprising forming a copper seed layer on the second barrier metal layer.

19. The method of claim 1, wherein the substrate comprises silicon.

20. The method of claim 19, further comprising forming the underlying insulation layer on the substrate.

* * * * *